Nov. 7, 1961 J. E. McNAMARA 3,007,816

DECONTAMINATION PROCESS

Filed July 28, 1958

INVENTOR.
John E. McNamara
BY
Mueller & Aichele
Attys.

United States Patent Office 3,007,816

Patented Nov. 7, 1961

3,007,816
DECONTAMINATION PROCESS

John E. McNamara, Phoenix, Ariz., assignor to Motorola, Inc., Chicago, Ill., a corporation of Illinois Filed July 28, 1958, Ser. No. 751,576
6 Claims. (Cl. 148—1.5)

Figure 1:
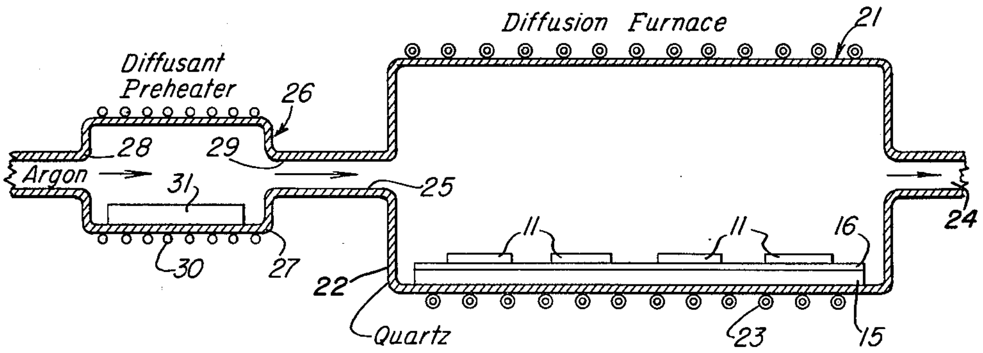

This invention relates to new and useful improvements in preparing semiconductor materials, and more particularly to methods for preventing contamination of and removing contaminants from semiconductor wafers having a diffused layer thereon. The wafers are subsequently made into dice for use in the manufacture of transistor or like devices.

This is a continuation-in-part of copending application Serial No. 622,931, filed November 19, 1956, now abandoned.

In recent years the development of semiconductor devices such as transistors, crystal diodes, and the like, has been given considerable emphasis in the electronics industry. In the manufacture of transistors and other semiconductor devices, semiconductor materials such as germanium or silicon are purified to a very high degree of purity and formed into single crystal structures of high resistivity. The crystals are then cut into wafers and the wafers into small dice, with the dice being provided with suitable connections for use as transistors, diodes, or the like. In the preparation of semiconductor material, it is necessary that extremely high orders of purity be obtained because of the fact that concentrations of impurities which would not cause difficulty in other metals of the highest purity such as copper or silver, for example, would render germanium or silicon virtually useless for transistor applications. In a sample of high purity germanium, one atom of an impurity per 100,000,000 germanium atoms is a typical ratio. It is therefore apparent that ordinary chemical and physical techniques for purifying chemical materials and ordinary methods of analysis and identification of impurities may not be operative when applied to the processing of materials of such a high purity.

Semiconductor materials such as germanium and silicon are generally prepared in a very high state of purity utilizing special physico-chemical techniques, such as zone melting, which have been especially developed for the purification of semiconductor materials. The high purity semiconductor materials may be used in a very pure intrinsic state or may be deliberately contaminated with controlled amounts of n-type or p-type impurities. The semiconductor material is then melted and formed into a single crystal which has a very high resistivity, if of the intrinsic type, and a lower resistivity if of the p-type or n-type, depending upon the amount of p-type or n-type impurities present. The single crystal of semiconductor material is then cut into wafers, and the wafers cut into dice which in turn may be provided with junctions or electrodes or contacts, as one might call suitable connections for transistor application.

In the manufacture of semiconductor devices using a crystal wafer or die, the wafer is treated by a diffusion process in an early step. In this process, wafers of semiconductor material of the intrinsic type or of the n′-type are heated to high temperatures and n-type impurity material diffused into the surface of the wafers to provide a thin surface layer of enriched or concentrated n-type material thereon. These wafers may then be cut into dice to which p-junctions may be made to form p-n-i-p transistors or p-n-n′-p transistors.

At the temperatures (about 800° C.) used in the diffusion process, it has been found that intrinsic type and n′-type semiconductor materials undergo marked changes in resistivity and in some cases are quickly converted to p-type semiconductors which are inoperative materials for the purposes for which these transistors were designed. It has been found that this change in resistivity and conversion of semiconductor materials is due to the presence of p-type contaminants such as copper, iron, and nickel, and oxides thereof, which are introduced during the handling of the wafers in spite of all precautions which have been taken to prevent contamination. This contamination is very serious inasmuch as high resistivity n′-type semicondutcor materials are irreparably damaged by contamination with copper (or other p-type contaminants) in quantities which are so minute that the contaminant is not discoverable by ordinary qualitative chemical techniques. Cyanides, such as potassium cyanide, have been used after the diffusion process to remove undesirable p-type contaminants in high resistivity semiconductor materials. Although this decontaminant has been used extensively because no other has heretofore been available, it has not been satisfactory because of its poisonous characteristics, and the resulting problems in handling the same.

The cyanide must be carefully handled, for as a gas even small quantities are lethal, and a person's skin can also be burned by contact. After use, the disposal of the cyanide is an equally serious problem. If it should combine with an acid in the drain, for instance, the lethal gas would form.

Aside from the poisonous characteristics of the cyanide, there are disadvantages for use in mass production of the diffused layer crystalline wafers because the cyanide is in a molten state in the chamber and hence cannot be as readily handled as can a solid, for instance. It has also been found that the cyanide as a decontaminant or leaching agent causes surface damage or contamination on the crystal which interferes with the subsequent application of the junction or electrode on the unit.

It is therefore one object of this invention to provide an improved method and a non-poisonous compound for preventing contamination of semiconductor materials during a diffusion process.

Another object of this invention is to provide an improved method for preventing contamination of semiconductor materials such as germanium and silicon by undesirable p-type materials during high temperature treatment of the semiconductors.

A further object of this invention is to provide a method of preventing contamination of germanium and silicon during the diffusion of selected impurities thereinto.

A still further object of this invention is to provide a simple, effective method of preventing and eliminating contamination in semiconductor materials which is applicable to large scale production of semiconductor devices.

A feature of this invention is the heating of a semiconductor material in the presence of a non-poisonous material which will combine selectively with an undesired contaminant at an elevated temperature.

Another feature of this invention is the provision of a non-poisonous material which is in a solid state during the carrying out of a method for preparing a diffused base transistor in which a high resistivity n′-type semiconductor material is heated in the presence of an n-type diffusant and the non-poisonous material combines selectively with undesired contaminants in the semiconductor material to leach or remove such contaminants.

A further feature of this invention is the heating of a high resistivity n′-type semiconductor material in antimony or arsenic vapor of a selected concentration in the presence of a leaching material which combines readily with copper, iron, and nickel, and oxides thereof so as to simultaneously diffuse the vapor into the semiconductor material and remove deleterious impurities that become apparent during the heating. The leaching or removal of the impurities is continued to the extent that they do not adversely affect the subsequent operation of a semiconductor device employing the material.

A still further feature of this invention is the heating of high resistivity n'-type germanium wafers in contact with an oxide of a metal of groups 4*b*, 5*b* and 6*b* of the periodic table, while diffusing a selected vapor into the surface of the wafers and wherein such oxide removes from such wafers undesirable substances or contaminants which would interfere with the subsequent use and operation of such wafers or the dice made up therefrom.

Another important feature of my invention is the provision of a solid decontaminant, and a method of leaching with the decontaminant during the diffusion of a layer on a semiconductor wafer, both of which lend themselves to mass production techniques.

Figure 2:
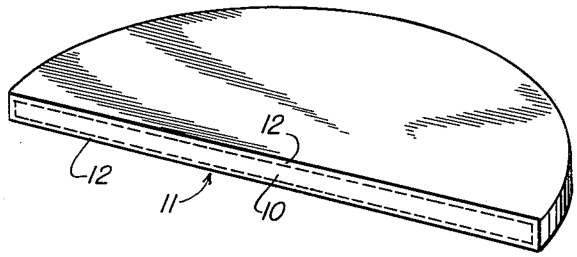

This invention may be understood more fully from the following detailed description of the methods forming specific embodiments thereof when read in conjunction with the appended drawing in which:

FIG. 1 is a schematic view of an apparatus for practicing the method of this invention; and FIG. 2 is an enlarged section view of a semiconductor wafer produced by the method of this invention.

This invention relates to improved methods of forming diffused base semiconductor wafers and preventing harmful contamination thereof with undesirable p-type contaminants. In the manufacture of diffused base transistors, a high resistivity i-type or n-type semiconductor material of high purity is subjected to a high temperature from about 600°–950° C. for germanium, and from about 600° to 1400° C. for silicon, for example. While being heated at this temperature, the semiconductor wafers are exposed to a controlled amount of a vapor of a donor or n-type impurity such as arsenic or antimony to produce a diffused surface layer over the entire surface of the wafers which has a higher concentration of donor atoms. The semiconductor wafers are placed on a surface of an oxide of a metal of group 4*b*, 5*b*, or 6*b* of the periodic table, such as molybdenum, tungsten, tantalum, or titanium. These metal oxides function to leach p-type contaminants such as copper, nickel, and iron, or oxides thereof from the semiconductor wafers which are present as a result of the diffusing process.

The metal oxides are believed to combine chemically with the p-type contaminants to form very stable salts such as copper molybdate, copper tungstate, etc. The tendency to form these compounds is so great that the metal oxides function as getters or scavengers to draw the undesired p-type impurities from the material around the wafers and to extract these impurities or contaminants from the wafers themselves. Such impurities or contaminants are extracted or leached to the extent that they have no subsequent adverse or deleterious effect on the operation of the wafers when they are formed into units of a desired size and assembled into semiconductor devices. Although the specification will refer to removal of contaminants, or preventing contamination, or to semiconductor materials being free of contaminants, it is understood that the terms of this character are related to the degree where there is no adverse effect as just explained. The resistivity of a specimen of a completed semiconductor die will indicate whether there is an undesirable amount of contaminant left in the specimen. Generally, high resistivity is required. In one commercially available transistor in which the germanium is treated according to the present invention, it is required that the resistivity be between 40 and 50 ohm-centimeters at room temperature. If the resistivity is lower than this, there is an undesirable amount of contaminant in the semiconductor unit.

Throughout this specification and in the accompanying claims, certain terminology is used which may require definition. P-type impurity atoms are atoms of a material which acts as an electron acceptor. N-type impurity atoms are atoms of a material which functions as an electron donor. P-type semiconductor material is a very pure semiconductor material such as germanium or silicon which contains a controlled minute amount of a p-type impurity.

N-type semiconductor materials are semiconductors such as germanium or silicon which contains a controlled minute amount of an n-type impurity. Intrinsic semiconductor materials, also known as i-type, are semiconductors such as germanium or silicon of very high purity which have either no impurities present or which have equal numbers of p-type and n-type impurities present. I-type germanium of high purity has a high resistivity of about 50 ohm-centimeters at room temperature but which decreases to about 20 ohm-centimeters at 70° C. N'-type semiconductor material is germanium or silicon of high purity which contains a very small number of n-type atoms and having a high resistivity in the range from 5 to 50 ohm-centimeters. Contaminants are atoms or molecules of undesired material, usually of the p-type, such as copper, iron, and nickel which are introduced into semiconductor material by minute surface contamination or through the equipment which is used for handling the semiconductor material. A diffusant is an impurity material of a desired type which is vaporized in controlled amounts and diffused into the surface of i-type or n'-type semiconductor material at high temperatures.

In FIG. 1 of the drawings, there is shown diagrammatically the apparatus for carrying out this process. In this process, thin wafers 11, about 0.004 in. thick, of an i-type or n'-type semiconductor material are prepared by known processes and are etched or lapped and thoroughly cleaned to provide clean, smooth surfaces. The wafers 11 are placed on a metal slab or boat 15 having a surface 16 in solid form as a power or as particles of an oxide of a metal of group 4*b*, 5*b* or 6*b* of the periodic table. The boat with the wafers positioned thereon is placed in a furnace 21 comprising an enclosure 22 which is preferably of quartz (indicated by the word "Quartz") or having a quartz lining and having a heating means such as an electric heating coil 23 capable of producing furnace temperatures of the order of 600°–950° C. when it is desired to process germanium and possibly higher for silicon. The furnace enclosure 22 has an outlet 24 and has an inlet 25 connected to a pre-heater 26. The pre-heater 26 is shown diagrammatically as a quartz enclosure 27 having an inlet 28 and an outlet 29 and surrounded by a heating means such as an electric heating coil 30. The inlet 28 to the pre-heater is connected to a source of an inert gas such as hydrogen, nitrogen, helium, or argon, so that the pre-heater 26 and the diffusion furnace 21 are continually swept with the inert gas.

A diffusant material 31 such as antimony or arsenic is placed in the diffusant pre-heater and heated to a temperature in the range from about 200° to 500° C. At this temperature, the diffusants have a very low vapor pressure and a very small amount is vaporized into the inert gas stream and carried thereby into the diffusion furnace. In the diffusion furnace, the inert gas together with a small amount of vaporized diffusant carried therein is raised to a temperature of the order of 600°–950° C., at which temperature the diffusant diffuses rapidly into the surface of the wafers 11. The diffusant vapor diffuses into the surface of the wafers and forms a solid solution or layer which is very greatly enriched in the n-type diffusant impurity with this enriched layer extending to a depth from .0001 to .002".

After a selected operating time during which the desired amount of disffusant has been diffused into the surface of the wafers, the introduction of the diffusant into the inert sweep gas is stopped. This may be accomplished by shutting off the flow of gas to the diffusion furnace or by cutting off the heat in the diffusant preheater. The diffusion furnace 21 and its contents are then cooled slowly and the wafers are removed from the furnace for further processing and assembly as transistor elements.

The foregoing procedure was followed in preparing a number of diffused base transistors according to the following examples.

*Example 1*

Wafers of n'-type germanium (n-type germanium of high resistivity in excess of about 10 ohm-centimeters) about 2" in diameter and having a thickness of about 0.004" are placed on the upper surface of a boat or slab 15 of molybdenum and having a molybdenum oxide surface layer 16 in contact therewith. The oxide is in the solid state and remains so during the processing. The boat or slab 15 and wafers 11 are placed in the furnace 21 in an atmosphere of argon and connected to a source of argon providing a continuous inert gas sweep through the furnace chamber.

The furnace 21 is maintained at a temperature of about 800° C. during the diffusion process. A small amount of diffusant material 31, preferably antimony, is placed in the diffusant preheater 26 and heated to a temperature of about 200 to 500° C. Argon is passed through the diffusant preheater and entrains antimony vapor which is carried to the diffusion furnace 21. The argon is maintained under a very slight super-atmospheric pressure to prevent contamination of the system in the event that minor leaks might occur. The antimony vapor carried in the argon sweep gas diffuses into the outer surface of the germanium wafers and forms a surface layer or diffused base layer 12 which consists of a high concentration of n-type material having low resistivity. The inner or undiffused portion 10 of the wafers is substantially unchanged and retains the same high resistivity of the n'-type germanium.

When diffused base transistors are prepared in this manner, the contaminants which might otherwise convert the n'-type germanium into p-type germanium are chemically conbined with and absorbed in the molybdenum oxide layer. The lower faces of the wafer, however, have substantially less penetration and lower concentration of antimony than are present in the upper base layers 12 because they are in contact with the oxide and not open to the diffusant to the same degree as upper faces. This would indicate that the antimony is absorbed slightly in the molybdenum oxide layer but to a much less extent than the contaminant material.

*Example 2*

In another experiment, wafers 11 of n'-type germanium (n-type germanium of high resistivity in excess of 10 ohm-centimeters) about 2" in diameter and 0.004" thick were placed on the upper surface of a molybdenum boat or slab 15. The boat 15 was placed in the furnace 21 and heated for a period of about 60 minutes at a temperature of about 800° C. During the heating period argon containing a very small trace of oxygen was circulated through the preheater 26 and the diffusion furnace 21. An n-type diffusant, antimony, was heated in the diffusant preheater 26 to a temperature in the range from about 200 to 500° C. During this treatment the surface of the molybdenum boat or slab 15 was oxidized and the molybdenum oxide thus formed functioned to leach contamination from the germanium wafers. The wafers had a diffused layer of low resistivity n-type material formed as a result of the solid solution of antimony in the surface of the germanium. The wafers were slowly cooled and withdrawn from the furnace as in the case of Example 1 and were found to be uncontaminated to the degree that semiconductor units formed out of the wafers operated satisfactorily when incorporated into transistors as in the case of wafers which were heated in contact with a previously oxidized surface on the molybdenum boat or slab 15.

*Example 3*

Wafers 11 of n'-type germanium (n-type germanium of high resistivity of at least 10 ohms centimeters) about 2" in diameter and having a thickness of about 0.004" were placed on the upper surface of a molybdenum boat 15. The boat and wafers were placed in a furnace 21 and heated to a temperature of about 800° C. A diffusant material, antimony, was placed in the preheater 26 and heated to a temperature of about 200 to 500° C. The system was then flushed and continually swept with argon which was completely free of oxygen. At the end of about 60 minutes the preheater and furnace were both allowed to cool and the wafers withdrawn from the furnace. The wafers 11 were found to have an outer diffused layer of low resistivity n-type germanium. However, the n'-type high resistivity core portion 10 of the wafers 11 was found to have been converted into p-type material. This contamination is due to the presence of substantially undetectable quanties of p-type contaminants on the surface of the wafers.

In this experiment, the surface of the n'-type germanium wafers was purified in the same manner as the wafers in the other experiments. These wafers were handled in the same manner as the wafers in the other experiments and were treated identically in all respects except that in this experiment the wafers were not contacted by molybdenum oxide. In the absence of contact with the molybdenum oxide the wafers were converted from n'-type germanium into p-type germanium, indicating that in the absence of the leaching agent of the present invention, the decontaminant was still present at the completion of the process.

*Example 4*

Germanium wafers 11 are placed on boats or slabs 15 of graphite having a layer 16 of molybdenum oxide covering the upper surface thereof. The wafers are heated in the diffusion furnace 21 under conditions identical with those described for Examples 1, 2 and 3 and antimony is diffused into the surface of the wafers to form base layers of low resistivity n-type material as in Examples 1 and 2. The wafers treated in this manner are found to be free from contamination to the degree that subsequent operation is satisfactory, and units formed from the wafers remain as high resistivity n-type germanium instead of being converted into p-type germanium as in Example 3.

*Example 5*

A layer 16 of titanium oxide is formed on the upper surface of the boat or slab 15 and wafers 11 are subjected to the diffusion process under the identical conditions described in Examples 1, 2 and 4. The wafers have diffused base layers of n-type material formed by diffusion of antimony into the surface thereof and the central core portion 10 of the wafers remains a high resistivity n'-type germanium as in the other examples. The titanium oxide layer combines with the undesired contaminants and prevents contamination of the wafers to any deleterious degree. As in the case of the use of molybdenum oxide in Examples 1, 2 and 4 the titanium oxide inhibits slightly the diffusion of the desired diffusants at the portions of the wafers in contact with the titanium oxide surface. It is possible therefore to use the metal oxide as a mask covering portions of the top surface of the wafers where a diffused base layer is not desired.

*Example 6*

When n'-type germanium wafers 11 are placed on the slab or boat 15 which has been provided with a layer 16 of tungsten oxide, and heated in the diffusion furnace 21, as in the other examples, the wafers are protected against contamination. The boat 15 and wafers 11 are placed in the furnace 21 and the furnace heated to a temperature of about 800° C. A diffusant, arsenic, is heated to a temperature of 200 to 500° C. in the preheater 26 and the arsenic vapors carried by an argon sweep into the diffusion furnace. After a period of about 60 minutes at 800° C., the wafers 11 have a diffused base layer of n-type low resistivity of the desired thickness. The furnace temperature is then decreased slowly and the boat and wafers removed from the furnace and cooled to room temperature. When germanium wafers are treated in this manner, the tungsten oxide is operative to prevent contamination of the wafers with p-type contaminants to a satisfactory degree.

*Example 7*

N′-type germanium wafers 11 are placed on a slab or boat 15 in contact with a layer 16 of tantalum oxide and heated in the diffusion furnace 21 and the wafers thereby protected against contamination. The boat 15 and wafers 11 are placed in the furnace 21 and the furnace heated to a temperature of about 800° C. A diffusant, arsenic, is heated to a temperature of 200 to 500° C. in the preheater 26 and the arsenic vapors carried by an argon sweep into the diffusion furnace. After a period of about 60 minutes at 800° C. the wafers 11 have a diffused base layer of n-type low resistivity of the desired thickness. The furnace temperature is then decreased slowly and the boat and wafers removed from the furnace and cooled to room temperature. When germanium wafers are treated in this manner, the tantalum oxide is operative to prevent contamination of the wafers with p-type contaminants to a degree such that the subsequent operation of a semiconductor unit formed from the wafer is not adversely affected.

N′-type and i-type silicon wafers can similarly be protected from contamination with p-type contaminants at elevated temperatures by heating the wafers in the presence of or in contact with a metal oxide which acts as a getter for the p-type contaminants. The getter referred to is also called a decontaminant, or leaching agent in this specification, and the terms are used interchangeably. The getter which is used must be one which has little or no reaction with the semiconductor material at elevated temperatures and which is substantially unreactive toward n-type diffusants.

The getter of the present invention, therefore, is a material which forms a very stable compound with the p-type contaminants and thus will remove contaminants from the surface of the semiconductor material and will also cause contaminants to diffuse out of the semiconductor material into the gettering agent. The oxides of the metals of groups 4*b*, 5*b*, and 6*b* of the periodic table are generally operative as getters for the decontamination of both germanium and silicon wafers both of the i-type and of the n′-type.

The process of the present invention may also be used for decontaminating semiconductor materials which are treated with p-type diffusants so long as the metal oxide used is one which will combine with the p-type contaminant but not with the p-type diffusant which is used, and it may be used for decontaminating simultaneously with the diffusing step in the overall process. This process, therefore, provides a method to eliminate undesired p-type contaminants such as copper, iron, nickel, and their oxides not only in the preparation of diffused base transistors but also in any process where it is required to heat the semiconductor wafers to an elevated temperature after the initial purification of the semiconductor material.

Inasmuch as the getter or decontaminant is non-poisonous as in the case of the cyanides, handling and processing is more rapid and less costly than prior methods. Furthermore, in view of the fact that the leaching can be carried out simultaneously with diffusion, as well as in succession, the alternative is provided of getting the same production with half the furnaces, or twice the production with the same number of furnaces. Thus important possibilities are provided for mass production.

I claim:

1. The method of fabricating diffused base semiconductor devices wherein the crystalline semiconductor unit thereof is relatively free of a contaminant which would adversely affect the operation of the device if it was present in the unit, said method including the steps of maintaining a body of crystalline semiconductor material in contact with at least one metallic oxide material selected from the group consisting of oxides of metals of group 4*b*, 5*b* and 6*b* of the periodic table which metallic oxide is in a solid state at a temperature below the melting point of the semiconductor body, heating said body and said oxide to a temperature which is above 600° C. and less than the melting point of said body, simultaneously exposing said body to a diffusant vapor, and providing units from said body to be used in the fabrication of the diffused base semiconductor device.

2. A method of treating a body of crystalline semiconductor material to remove from such material conductivity-modifying impurities which are present therein to a degree unsatisfactory for subsequent operation of the material in semiconductor devices, which method comprises heating the semiconductor body to a temperature above about 600° C. and below the melting point of the semiconductor material while maintaining the semiconductor body in contact with a surface of molybdenum oxide on a body of molybdenum, cooling said bodies, and separating said bodies from each other.

3. A method of treating a body of crystalline semiconductor material to prevent such material from becoming contaminated with p-type impurities to a degree unsatisfactory for subsequent operation of the material in semiconductor devices, which method comprises heating the semiconductor body to a temperature above about 600° C. and below the melting point of the semiconductor material while maintaining said semiconductor body in contact with a surface on a body of metal selected from groups 4*b*, 5*b* and 6*b* of the periodic table, which surface consists of an oxide of said metal.

4. A method of treating a body of crystalline semiconductor material to prevent contamination of such material with undesired conductivity-modifying impurities to a degree rendering the semiconductor material unsatisfactory for subsequent operation in semiconductor devices, said method comprising, heating the body of semiconductor material to a temperature above about 600° C. and below the melting point of the semiconductor material while maintaining such material in contact with a surface on another body which surface is comprised of at least one metallic oxide material selected from the group consisting of oxides of metals of groups 4*b*, 5*b*, and 6*b* of the periodic table.

5. A method of treating a body of crystalline semiconductor material having opposed major faces to provide a diffused layer of selected conductivity-type in such body at one of said faces, said method comprising maintaining at least a major area of a selected one of said faces of said semiconductor body in face-to-face contact with a surface on another body which surface is comprised of at least one metallic oxide material selected from the group consisting of oxides of metals of groups 4*b*, 5*b*, and 6*b* of the periodic table, the other of said faces of said semiconductor body being exposed, and simultaneously heating said semiconductor body and said other body at a temperature above about 600° C. and below the melting point of the semiconductor material while maintaining the same in an atomsphere containing a controlled minor amount of diffusant vapor of selected conductivity-type determining impurity material.

6. A method of treating a body of crystalline semiconductor material having opposed major faces to provide a diffused layer of selected conductivity-type in said body at one face thereof, which method comprises, maintaining at least a major area of a selected one of said faces of said semiconductor body in contact with molybdenum oxide material on a surface of a body of molybdenum with the other face of said semiconductor body in exposed condition, and simultaneously heating said semiconductor body and said molybdenum body at a temperature above about 600° C. and below the melting point of the semiconductor material while maintaining the same in an atmosphere containing a controlled minor amount of diffusant vapor of selected conductivity-type determining impurity material.

References Cited in the file of this patent

UNITED STATES PATENTS

| | | |
|---|---|---|
| 2,072,342 | McMaster et al. | Mar. 2, 1937 |
| 2,368,060 | Wooten | Jan. 23, 1945 |
| 2,788,300 | Dawson | Apr. 9, 1957 |
| 2,802,760 | Derick et al. | Aug. 13, 1957 |
| 2,834,697 | Smits | May 13, 1958 |
| 2,855,368 | Perdijk et al. | Oct. 7, 1958 |